(12) United States Patent
Huang et al.

(10) Patent No.: US 8,749,038 B2
(45) Date of Patent: Jun. 10, 2014

(54) SUBSTRATE MODULE HAVING AN EMBEDDED PHASE-LOCKED LOOP, INTEGERATED SYSTEM USING THE SAME, AND FABRICATING METHOD THEREOF

(75) Inventors: Chung-Er Huang, Taipei (TW); Nan-Cheng Chen, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 1097 days.

(21) Appl. No.: 12/010,456

(22) Filed: Jan. 25, 2008

(65) Prior Publication Data

US 2009/0190706 A1 Jul. 30, 2009

(51) Int. Cl.
*H01L 23/02* (2006.01)

(52) U.S. Cl.
USPC .................. 257/686; 438/109; 257/E23.124; 257/E21.499

(58) Field of Classification Search
USPC .................. 257/E27.009, E21.704, E23.062, 257/E23.023–E23.025, E23.029, E21.502, 257/686, 700, E23.106, E21.499, E23.001, 257/E23.009, E23.006, E23.124, E23.125, 257/E23.071, E29.001; 174/260–162; 361/760–766; 331/108 D; 455/180.3, 455/260; 438/106, 109
See application file for complete search history.

(56) References Cited

U.S. PATENT DOCUMENTS

| | | | |
|---|---|---|---|
| 6,436,804 B2 * | 8/2002 | Igarashi et al. | 438/617 |
| 6,668,025 B1 * | 12/2003 | Sumi et al. | 375/326 |
| 7,328,383 B2 * | 2/2008 | Chen et al. | 714/724 |
| 7,409,190 B2 * | 8/2008 | Murata | 455/76 |
| 7,501,915 B2 * | 3/2009 | Murata | 333/185 |
| 7,989,707 B2 * | 8/2011 | Yamano et al. | 174/260 |
| 2002/0049042 A1 * | 4/2002 | Oida et al. | 455/90 |
| 2003/0036020 A1 * | 2/2003 | Kubota | 430/313 |
| 2003/0143971 A1 * | 7/2003 | Hongo et al. | 455/313 |
| 2003/0206405 A1 * | 11/2003 | Zu et al. | 361/792 |
| 2005/0272399 A1 * | 12/2005 | Murata | 455/333 |
| 2006/0097906 A1 * | 5/2006 | Heide | 342/22 |
| 2006/0120058 A1 * | 6/2006 | Fairchild et al. | 361/761 |
| 2008/0122061 A1 * | 5/2008 | Edwards | 257/690 |
| 2008/0272829 A1 * | 11/2008 | Maeda | 327/518 |

FOREIGN PATENT DOCUMENTS

| | | | | |
|---|---|---|---|---|
| JP | 08079071 A * | 3/1996 | | H03L 7/18 |
| WO | WO 2007069606 A1 * | 6/2007 | | H01L 21/60 |

OTHER PUBLICATIONS

English translation of JP08079071 Sasayama.*

* cited by examiner

*Primary Examiner* — Daniel Luke
*Assistant Examiner* — Latanya N Crawford
(74) *Attorney, Agent, or Firm* — Rosenberg, Klein & Lee

(57) ABSTRACT

A substrate module having an embedded phase-locked loop is cooperated with at least one function unit mounted thereon for forming an integrated system. The substrate module includes a base, a multi-layer structure, a built-in circuit unit, and an external circuit unit. The built-in circuit unit is integrated inside the multi-layer structure and the multi-layer structure is formed in the base. The external circuit unit is mounted on the upper surface of the base and is electrically coupled to the built-in circuit unit for jointly forming a phase-locked loop, so as to cooperate with the function unit.

9 Claims, 4 Drawing Sheets

SUBSTRATE MODULE HAVING AN EMBEDDED PHASE-LOCKED LOOP, INTEGERATED SYSTEM USING THE SAME, AND FABRICATING METHOD THEREOF

BACKGROUND OF THE INVENTION

1. Field of the Invention

The present invention is related to an integrated system, and more particularly to an integrated system using a substrate module having an embedded phase-locked loop, and a fabricating method thereof.

2. Description of Related Art

Reference oscillation signals are the bases of digital logic operation. Although the frequency of the output signal of crystal oscillator has a better stability than LC oscillator, the frequency thereof is harder to alter. The oscillation circuit manufactured by using phase-locked loop has the advantages of wide oscillation frequency range and highly stable frequency, so that it is adopted by many electronic systems.

Please refer to FIG. 1, which is a schematic view showing the system architecture of a typical phase-locked loop. As shown, the phase-locked loop 10 includes a base frequency oscillator 101, a phase frequency comparator 103, a voltage controlled oscillator 105 and a loop filter 107. The base frequency oscillator 101 outputs an oscillation signal with frequency fr, and the voltage controlled oscillator 105 outputs an oscillation signal with frequency fo. Then, the phase frequency comparator 103 compares fr with fo for outputting an error signal PD which represents the magnitude relationship of fr and fo by positive/negative pulse. Then, the loop filter 107 converts the error signal PD into DC voltage signal Vr for outputting to control the output frequency fo of the voltage controlled oscillator 105, thereby the feedback architecture can control fo and fr to be identical. Therefore, the output frequency of the voltage controlled oscillator 105 and the base frequency oscillator 101 are synchronously stable.

Through utilizing frequency divider to alter the parameters of the feedback path of the phase-locked loop, all kinds of output frequencies can be obtained for be applied as clock generator in computer system. In communication system, the frequency synthesizer mounted at the front end of various wired and wireless transceiver devices also utilizes the phase-locked loop to produce accurate local oscillation frequency signal, so as to achieve frequency up conversion and down conversion of the RF signal. Besides, many control systems (such as, a CD-ROM drive control system) also utilize the phase-locked loop technology to achieve precise control. Therefore, phase-locked loop gradually becomes an essential for many electronic systems.

Owing to the technical improvement and also the combination of semiconductor manufacturing technology, chip scale package technology and PCB forming technology, the electronic system can be integrated as a miniaturized module product for being one of the components of backend product, so that it can be directly mounted on the circuit board, thereby reducing the design complicity of backend products. Besides, for cooperating with multi-function integration and miniaturization of electronic products, the module products also have the need in integration and miniaturization. Take RF module as example. The current development thereof is namely to integrate multiple communication systems, or integrate the communication system and the application system in one single module. However, owing to the integration, the circuit inside the module must be increased.

In view that the circuit and components of phase-locked loop always occupy a certain construction area and only leave limited area for other usage, which might increase the difficulty in integration, the applicant provides the present invention for improving thereof.

SUMMARY OF THE INVENTION

Therefore, the object of the present invention is to provide a substrate module having an embedded phase-locked loop, an integrated system using the same and a fabricating method thereof. Through embedding the phase-locked loop in the substrate module, the surface elements and circuit of the integrated system can be reduced, so as to reduce construction area, increase construction density, shorten signal transmission path and improve function and reliability of the substrate module and the relative integrated system.

The present invention discloses a substrate module having an embedded phase-locked loop including a base, a multi-layer structure, a built-in circuit unit and an external circuit unit. The multi-layer structure is formed in the base and the built-in circuit unit is integrated inside the multi-layer structure. The external circuit unit is mounted on the upper surface of the base and electrically coupled to the built-in circuit unit for jointly forming a phase-locked loop.

The present invention further discloses a fabricating method for the substrate module having an embedded phase-locked loop, including steps of: providing the base; integrating the built-in circuit unit to form a multi-layer structure in the base; and mounting the external circuit unit on the upper surface of the base and electrically coupling the external circuit unit to the built-in circuit unit.

Furthermore, the present invention also discloses an integration module including the substrate module having an embedded phase-locked loop, and at least one function unit, wherein the function unit is mounted on the upper surface of the base and is electrically coupled to the phase-locked loop.

Besides, the present invention further discloses a fabricating method of an integration module including steps of: providing the substrate module having an embedded phase-locked loop; and mounting at least one function unit on the upper surface of the base and electrically coupling the function circuit to the phase-locked loop.

BRIEF DESCRIPTION OF THE DRAWINGS

The foregoing aspects and many of the attendant advantages of this application will be more readily appreciated as the same becomes better understood by reference to the following detailed description, when taken in conjunction with the accompanying drawings, wherein.

DETAILED DESCRIPTION OF PREFERRED EMBODIMENTS

Figure 1:
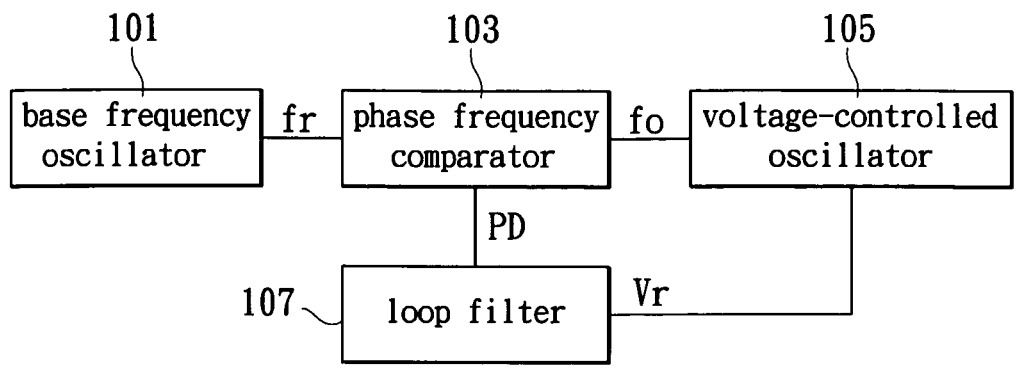
FIG. 1 is a schematic view showing the system architecture of a typical phase-locked loop.
Figure 2:
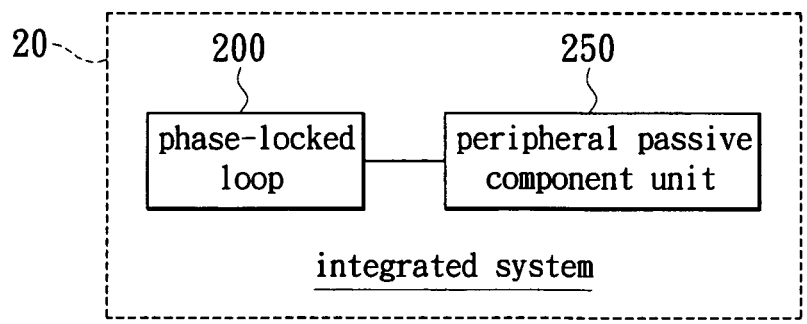
FIG. 2 is a schematic view showing the system architecture of an integrated system according to the present invention.

The present invention embeds the phase-locked loop in the internal portion of the substrate module for increasing the surface construction area of the integrated system. Please refer to FIG. 2, which is a schematic view showing the system architecture of the integrated system according to the present invention. As shown, the integrated system includes a phase-locked loop 200, and a function unit 250 electrically coupled to the phase-locked loop 200 for having a concurrent operation.

The integrated system 20 is a module system product made by semiconductor manufacturing technology, packaging technology and PCB forming technology. The function unit 250 is generally an electronic system cooperating with the phase-locked loop 200. In an embodiment, the function unit 250 is a logic operation system (such as, a computer system), and the phase-locked loop 200 is used as the clock source of this system, so as to output at least one working clock signal to the function unit 250.

In another embodiment, the function unit 250 is a communication front end RF signal processing system, and the phase-locked loop 200 is used as a frequency synthesizer of this system, so as to output at least one local oscillation signal to a mixer of the function unit 250 for supporting RF signal processing. Alternatively, the function unit 250 can output the RF signal to the phase-locked loop 200 for modulating, such as, up converting and down converting, the frequency of the RF signal, and the modulated RF signal is transmitted back to the function unit 250.

In a further embodiment, the function unit 250 is a synchronous optical communication system which utilizes the phase-locked loop 200 to process clock data recovery for the data signal.

Except the embodiments described above, the function unit 250 also can be any control system which utilizes the phase-locked loop 200 to achieve a precise control, or to generate a working clock signal. Since the circuit structures of the phase-locked loops 200 in the above described embodiments are well known, unnecessary details are omitted.

Moreover, the integrated system also can include one or more phase-locked loops and function units. Although the figure is illustrated by single phase-locked loop 200 and function unit 250, it is not limited.

Figure 3:
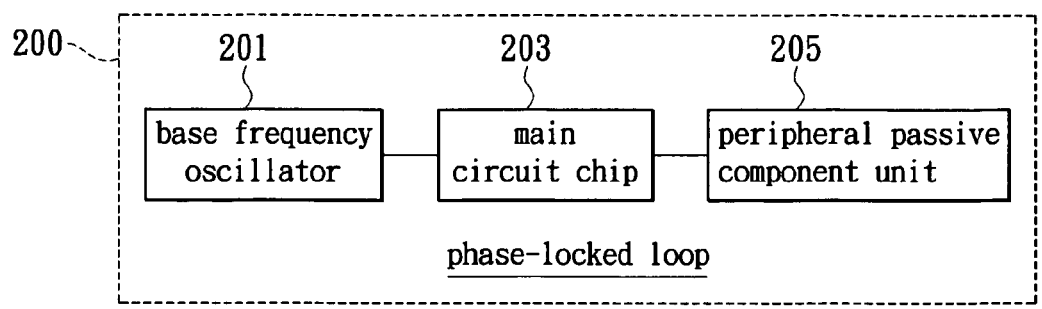
FIG. 3 is a schematic view showing the element architecture of a phase-locked loop in the present invention.

Please refer to FIG. 3, which is a schematic view showing the element architecture of the phase-locked loop 200 in the present invention. The main circuit of the phase-locked loop 200 can be integrated as an IC chip for facilitating application. As shown in FIG. 3, the components of the phase-locked loop 200 include at least one base frequency oscillator 201, a main circuit chip 203 and a peripheral passive component unit 205, wherein the base frequency oscillator 201 and the peripheral passive component unit 205 are coupled to the main circuit chip 203 for concurrent operation.

Since mounting the module on the surface limits the usable area of the module surface and also increases the integration difficulty, the present invention utilizes the built-in construction technology to embed the phase-locked loop 200 in the substrate module. Please refer to FIG. 3 and FIG. 4, which is a schematic view showing the architecture of the integrated system using the substrate module having an embedded phase-locked loop according to the present invention. Here, the base frequency oscillator 201, the main circuit chip 203 and the peripheral passive component unit 205 of the phase-locked loop 200 are divided into a built-in circuit unit 225 and an external circuit unit 220.

Figure 4:
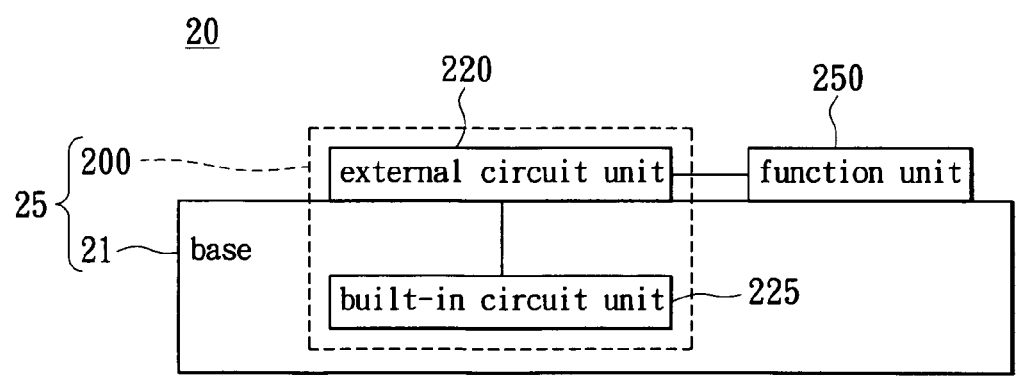
FIG. 4 is a schematic view showing the architecture of the integrated system using a substrate module having an embedded phase-locked loop according to the present invention.

In FIG. 4, the substrate module 25 having an embedded phase-locked loop includes a base 21, a multi-layer structure (not shown), a built-in circuit unit 225 and an external circuit unit 220. The multilayer structure is formed in the base 21, the built-in circuit unit 225 is integrated inside the multi-layer structure through semiconductor manufacturing technology or PCB layer build-up technology, the external circuit unit 220 is mounted on the upper surface of the base 21 and is electrically coupled to the built-in circuit unit 225 for jointly forming the phase-locked loop 20, and the function unit 250 is identically mounted on the upper surface of the base 21 and is electrically coupled to the phase-locked loop 200.

Figure 5:
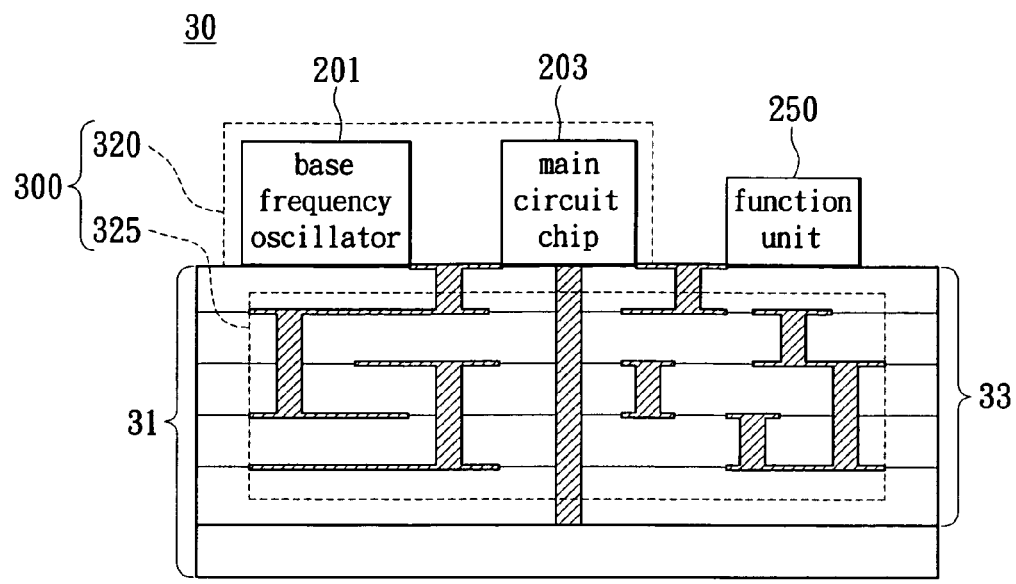
FIG. 5 is schematic view showing the integrated system using the substrate module having an embedded phase-locked loop in a first embodiment according to the present invention.
Figure 6:
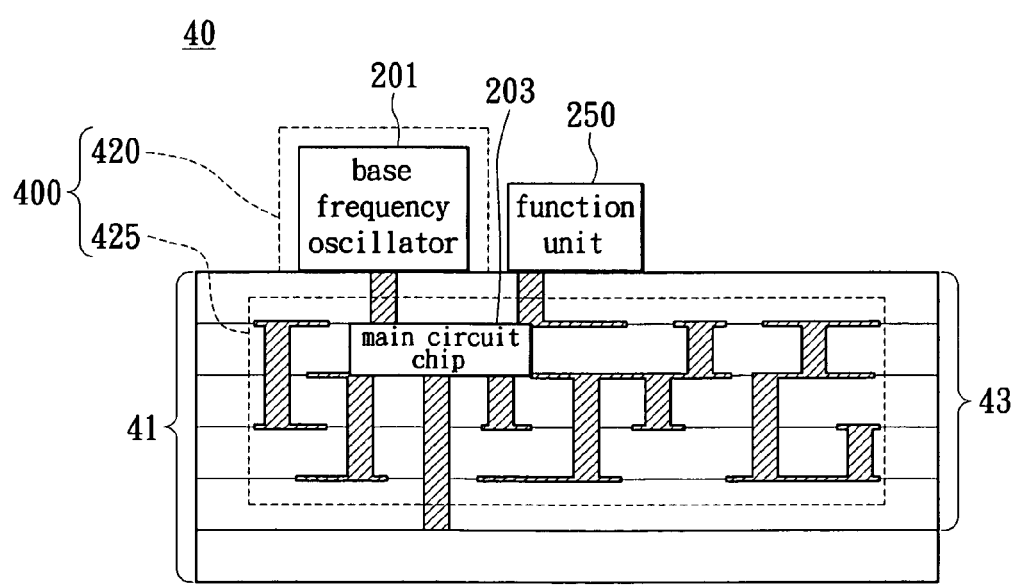
FIG. 6 is schematic view showing the integrated system using the substrate module having an embedded phase-locked loop in a second embodiment according to the present invention.

Please refer to FIG. 5 and FIG. 6 which are schematic views showing the integrated systems using the substrate module having an embedded phase-locked loop in two embodiments according to the present invention.

In the integrated system 30 of FIG. 5, the built-in circuit unit 325 mainly includes passive components, and the base frequency oscillator 201, the main circuit chip 203 and other elements, which are not suitable for embedding, are included in the external circuit unit 320.

The methods for integrating the multi-layer structure 33 and the built-in circuit unit 33 in the base 31 can be two:

In a first method, a semiconductor manufacturing technology is utilized to process the silicon chip material, wherein according to the circuit features, base material with specific dielectric coefficient and resistor, and organic glass fiber base are used to stack and integrate the passive components, so as to form built-in capacitor, resistor and transmission line, thereby forming the multi-layer structure 33.

In a second method, a PCB layer build-up technology is utilized, wherein metal conducting wire or thin metal resistor thin film element is mounted on the dielectric material for forming multi-layer structure 33.

After forming the multi-layer structure 33 in the base 31, the circuit and solder pad then can be formed on the surface thereof for mounting the elements of the external circuit unit 320 and the function unit 250. The elements of the external circuit unit 320 and the function unit 250 can be mounted to the surface of the base 31 simultaneously through a SMT procedure, or all or partial of the elements of the external circuit unit 320 are mounted on the base 31 to form a sub-module.

In the integrated system of FIG. 6, except the passive component, the built-in circuit unit 425 further includes the main circuit chip 203. The multi-layer structure 43 can be formed by PCB layer build-up technology through integrating the metal conducting wire and the thin metal resistor thin film element on the dielectric material, and during this procedure, the main circuit chip 203 is buried therein. In this embodiment, the main circuit chip 203 should be chosen to be a thinner chip. After forming the multi-layer structure 43 in the base 41, the circuit and solder pad then can be formed on the surface thereof for mounting the elements of the external circuit unit 420 and the function unit 250.

The built-in component circuit reduces the transmission distance, so as to improve the electric property and the reliability of module. As adopting this fabricating process, a heat conducting pillar can be connected to the bottom layer of the base 31, 41, so as to facilitate heat dispersion for the main circuit chip 203. In addition, in the built-in circuit unit 325, 425 integrated inside the multi-layer structure 33, 43, the mounting of the passive components and the transmission line structure can be previously simulated by computer software through referencing to the dielectric parameter of the base material, so as to obtain a best electric feature.

Figure 7:
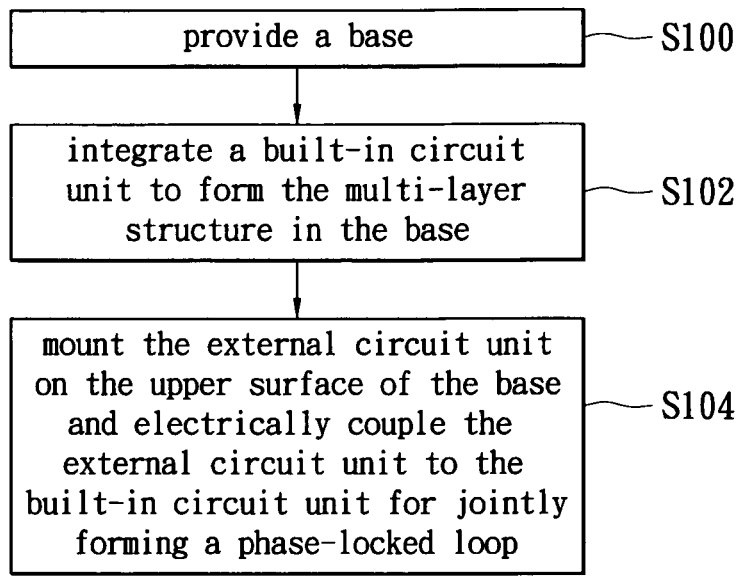
FIG. 7 is a flow chart showing the fabricating method of the substrate module having an embedded phase-locked loop according to the present invention.

The fabricating method of the substrate module having an embedded phase-locked loop and the integrated system using the same are provided as follows. Please refer to FIG. 7, which is a flow chart showing the fabricating method of the substrate module having an embedded phase-locked loop according to the present invention. Please also refer to FIG. 4 for understanding the relative structure thereof. The fabricating method includes steps of:

First, providing the base 21 (S100);

Then, integrating the built-in circuit unit 225 to form the multi-layer structure in the base 21 (S102); and Finally, mounting the external circuit unit 220 on the upper surface of the base 21 and electrically coupling the external circuit unit 220 to the built-in circuit unit 225 for jointly forming a phase-locked loop 200 (S104).

Here, the multi-layer structure is formed through semiconductor manufacturing technology or PCB layer build-up technology.

Figure 8:
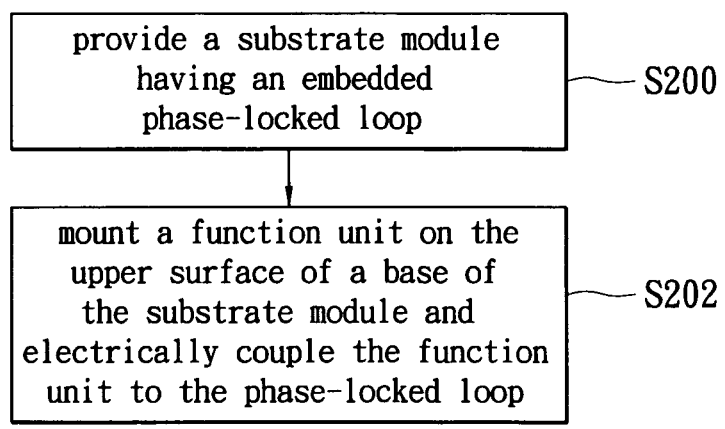
FIG. 8 is a flow chart showing the fabricating method of the integrated system according to the present invention.

Please refer to FIG. 8, which is a flow chart showing the fabricating method of the integrated system according to the present invention, and please also refer to FIG. 4 for understanding the relative structure thereof. The fabricating method includes steps of:

First, providing a substrate module 25 having an embedded phase-locked loop 200 (S200); and Then, mounting the function unit 250 on the upper surface of the base 21 of the substrate module 25 and electrically coupling the function unit 250 to the phase-locked loop 200 (S202).

Through the embodiments described above, the substrate module having an embedded phase-locked loop, the integrated system using the same and the fabricating method thereof according to the present invention integrate the phase-locked loop in the base of the substrate module for reducing the occupied area of the phase-locked loop, so as to provide more sufficient area for mounting function circuit. Besides, embedding the phase-locked loop in the base also can shorten the signal transmission path, so that the function and reliability of the substrate module and the whole integrated system can be improved. Consequently, the technology for embedding the phase-locked loop in the base of the substrate module according to the present invention simplifies the construction of the substrate module, reduces the relative manufacturing cost, increases the usable space for other circuits, reduces the difficulty of the substrate module to integrate more function units, and provides the substrate module a better electric characteristic, so that it benefits not only the manufacturer but also the backend application.

It is to be understood, however, that even though numerous characteristics and advantages of the present application have been set forth in the foregoing description, together with details of the structure and function of the application, the disclosure is illustrative only, and changes may be made in detail, especially in matters of shape, size, and arrangement of parts within the principles of the application to the full extent indicated by the broad general meaning of the terms in which the appended claims are expressed.

What is claimed is:

1. An integration module having an embedded phase-locked loop, comprising: a base, comprising a multi-layer structure formed therein; an embedded phase-locked loop, comprising: a built-in circuit unit, integrated into the multi-layer structure and fully embedded by the multi-layer structure, wherein the built-in circuit unit further comprises a main circuit chip and a passive component; an external circuit unit, mounted on an upper surface of the base and electrically coupled to the built-in circuit unit, wherein the external circuit unit comprises a base frequency oscillator; a heat conducting pillar, connected the main circuit chip to a bottom layer of the base; and a function unit, electrically coupled to the phase-locked loop for having a concurrent operation.

2. The integration module as claimed in claim 1, wherein the multi-layer structure is formed by semiconductor manufacturing technology or PCB layer build-up technology.

3. The integration module as claimed in claim 2, wherein the main circuit chip is buried inside the multi-layer structure through the PCB layer build-up technology.

4. The integration module comprising as claimed in claim 1, wherein the function unit is mounted on the upper surface of the base and is electrically coupled to the embedded phase-locked loop.

5. The integration module as claimed in claim 4, wherein the function unit is a logic operation, and the embedded phase-locked loop outputs at least one working clock signal to the logic operation.

6. The integration module as claimed in claim 4, wherein the function unit is a communication front end RF signal processing system, and the embedded phase-locked loop outputs at least one local oscillation signal to the communication front end RF signal processing system.

7. The integration module as claimed in claim 6, wherein the communication front end RF signal processing system outputs an radio frequency (RF) signal to the embedded phase-locked loop, and the embedded phase-locked loop adjusts the RF signal before transmitting the adjusted RF signal back to the communication front end RF signal processing system.

8. The integration module as claimed in claim 4, wherein the function unit is a synchronous optical communication system, and the synchronous optical communication system outputs a data signal to the phase-locked loop, the phase-locked loop processes the data signal for a clock data recovery, before transmitting the processed data signal back to the synchronous optical communication system.

9. A fabricating method of an integration module, comprising steps of:

providing a base; forming a heat conducting pillar on a bottom layer of the base;

integrating the built-in circuit unit in the base to form a multi-layer structure in the base, wherein the built-in circuit unit comprising a main circuit chip and a passive component is embedded by the base; wherein the heat conducting pillar connecting the main circuit chip to the bottom layer of the base; mounting the external circuit unit on the upper surface of the base and electrically coupling the external circuit unit to the built-in circuit unit; and mounting the function unit on the upper surface of the base and electrically coupling the function unit to the phase-locked loop.

\* \* \* \* \*